United States Patent
Chang et al.

(10) Patent No.: US 8,450,778 B2
(45) Date of Patent: May 28, 2013

(54) METHOD AND APPARATUS FOR MEMORY CELL LAYOUT

(75) Inventors: Jacklyn Chang, San Ramon, CA (US);
Kuoyuan Hsu, San Jose, CA (US);
Derek C. Tao, Fremont, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 147 days.

(21) Appl. No.: 12/862,387

(22) Filed: Aug. 24, 2010

(65) Prior Publication Data
US 2012/0049374 A1    Mar. 1, 2012

(51) Int. Cl.
*H01L 27/11* (2006.01)

(52) U.S. Cl.
USPC ............... 257/207; 257/369; 257/E21.661; 257/E27.099; 365/154

(58) Field of Classification Search
USPC .... 257/207, 369, E21.661, E27.099; 365/154
See application file for complete search history.

(56) References Cited

U.S. PATENT DOCUMENTS

| | | | |
|---|---|---|---|
| 4,982,365 A * | 1/1991 | Ohtani et al. | 365/189.11 |
| 7,495,948 B2 * | 2/2009 | Suzuki et al. | 365/154 |
| 7,957,176 B2 * | 6/2011 | Otsuka | 365/154 |
| 2007/0235765 A1 * | 10/2007 | Liaw | 257/207 |
| 2008/0062802 A1 * | 3/2008 | Lin et al. | 365/227 |
| 2009/0285010 A1 | 11/2009 | Tao et al. | |

OTHER PUBLICATIONS

Yabuuchi, M. et al., "A 45nm 0.6V Cross-Point 8T SRAM with Negative Biased Read/Write Assist," Symposium on VLSI Circuits Digest of Technical Papers, 2009, 15-4, pp. 158-159.
Fukano, G. et al., "A 65 nm 1Mb SRAM Macro with Dynamic Voltage Scaling in Dual Power Supply Scheme for Low Power SoCs", Non-Volatile Semiconductor Memory Workshop, May 18-22, 2008 and 2008 International Conference on Memory Technology and Design. NVSMW/ICMTD 2008 (Joint), pp. 97-98.

* cited by examiner

*Primary Examiner* — John C Ingham
(74) *Attorney, Agent, or Firm* — Duane Morris LLP

(57) ABSTRACT

A semiconductor device has first and second interconnect structures in first and second columns, respectively, of an array. Each of the first and second interconnect structures has a reference voltage node and first, second, third, and fourth conductors that are coupled to each other and formed at a first layer, a second layer, a third layer, and a fourth layer, respectively, over a substrate having a plurality of devices defining a plurality of bit cells. The reference voltage node of each interconnect structure provides a respectively separate reference voltage to a bit cell corresponding to said interconnect structure. None of the first, second, third, and fourth conductors in either interconnect structure is connected to a corresponding conductor in the other interconnect structure. The second layer is above the first layer, the third layer is above the second layer, and the fourth layer is above the third layer.

17 Claims, 9 Drawing Sheets

METHOD AND APPARATUS FOR MEMORY CELL LAYOUT

BACKGROUND

Static random access memory (SRAM) is a type of semiconductor memory that stores data in the form of bits using bistable circuitry without the need for refreshing. An SRAM cell may be referred to as a bit cell because it stores a bit of information. Memory arrays include multiple bit cells arranged in rows and columns. Each bit cell in a memory array typically includes connections to a power supply voltage and to a reference voltage. Bit lines are used for accessing a bit cell, with a word line controlling connections to the bit lines. A word line may be coupled to the bit cells in a row of a memory array, with different word lines provided for different rows.

BRIEF DESCRIPTION OF THE DRAWINGS

The following will be apparent from elements of the figures, which are provided for illustrative purposes and are not necessarily to scale.

DETAILED DESCRIPTION

Figure 1A:
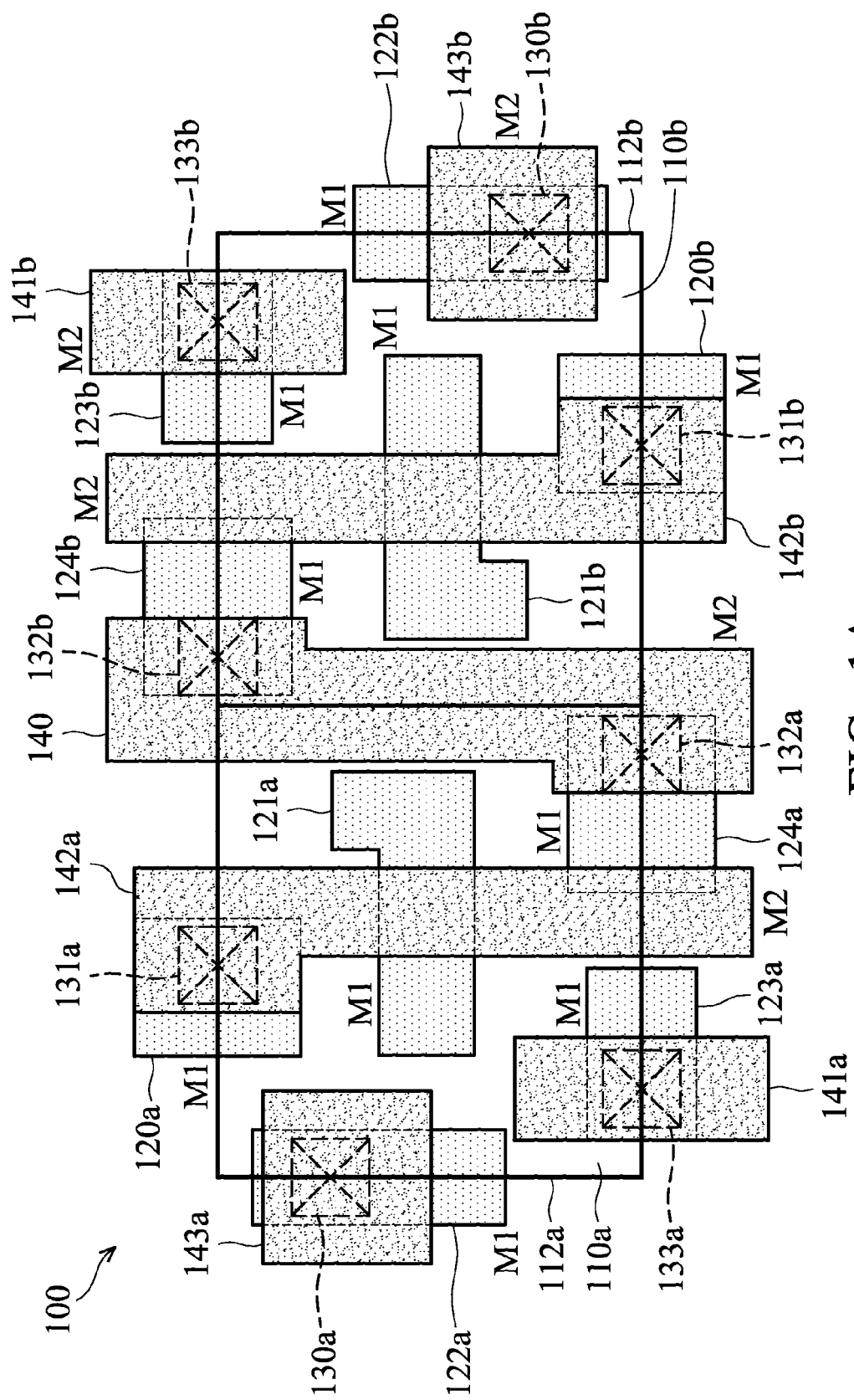
FIG. 1A is a layout diagram showing a first layer and a second layer of an interconnect structure in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "vertically," "downwardly," "upwardly," etc.) should be construed to refer to the orientation as then described or as shown in the drawing under discussion. These relative terms are for convenience of description and do not require that the apparatus be constructed or operated in a particular orientation.

FIG. 1A is a layout diagram showing a first layer and a second layer of an interconnect structure 100 in accordance with some embodiments. FIG. 1A shows a plan view of the interconnect structures. First, second, third, and fourth layers M1, M2, M3, and M4, which may be metal layers, are above a substrate 102 and are shown in FIG. 1F. The designations "M1", "M2", "M3" and "M4" stand for "metal-one", "metal-two", "metal-three", and "metal-four", respectively. The first layer M1 is nearest to the substrate, with the second layer M2 above the first layer M1, the third layer M3 above the second layer M2, and the fourth layer M4 above the third layer M3. The substrate 102 has multiple devices defining multiple bit cells, which may be static random access memory (SRAM) bit cells (not shown). The interconnect structure 100 may be referred to as an interconnect cell. The interconnect structure 100 exhibits symmetry in that the plan views of layout shown in FIGS. 1A-E are invariant under a rotation of 180 degrees.

The interconnect structure 100 includes a first section 110a and a second section 110b, which are shown in FIG. 1A as left and right halves, respectively. A logical boundary for section 110a is shown by a square 112a; it is understood that no physical object marks the boundary, but the logical boundary is shown for convenience and illustrative purposes. Similarly, a logical boundary for section 110b is shown by a square 112b. The interconnect structure 100 is disposed in a matrix (array) of such interconnect structures, with one such structure shown in FIG. 1A. Components extending beyond the logical boundaries are shared with adjacent cells on the other side of each boundary. For example, conductor M1 122b in FIG. 1A of cell 100 is shared with a cell (not shown) to the right of cell 100 in FIG. 1A. Such a matrix arrangement and sharing across cell boundaries is better understood with reference to FIG. 1E, described further below. Throughout FIGS. 1A-1E, nomenclature based on the above-described symmetry of interconnect structure 110 is adopted, with components in the left half of an interconnect structure (section 110a) labeled with a suffix "a" and components in the right half (section 110b) labeled with a suffix "b".

Figure 4:
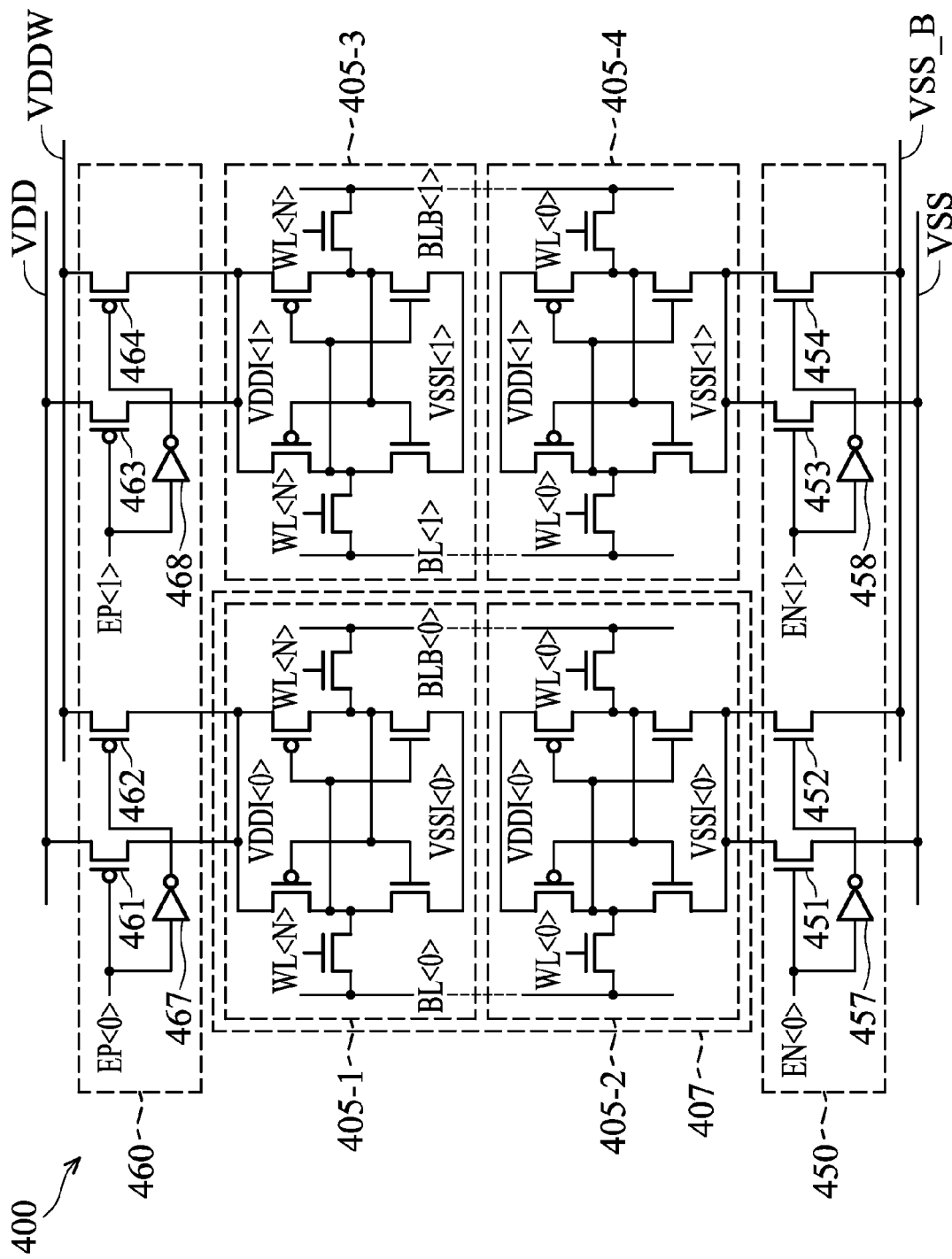
FIG. 4 is a circuit diagram of a memory circuit in accordance with some embodiments.

As shown in FIG. 1A, the first layer includes M1 conductors 120a and 120b, which are bit lines; M1 conductors 121a and 121b, which are interconnects; M1 conductors 122a and 122b, which are word lines; M1 conductors 123a and 123b, which provide electrical coupling of a bit cell (e.g., a static random access memory (SRAM) bit cell) to a reference node having a reference voltage VSSI; and M1 conductors 124a and 124b, which provide coupling of the bit cell to a power supply node having a power supply voltage VDDI. The conductors in FIG. 1A, as well as those in FIGS. 1B-E, may be known conductors formed of an electrically conductive material such as copper. Components of such a bit cell such as transistors are not shown in FIGS. 1A-E for convenience but are shown in FIGS. 2 and 4. Vias 130a, 130b, 131a, 131b, 132a, 132b, 133a, and 133b are provided as shown in FIG. 1A for coupling of conductors in the first and second layers.

As shown in FIG. 1A, the second layer includes a M2 conductor 140, which provides coupling to VDDI; M2 conductors 141a and 141b, which provide coupling to VSSI; conductors 142a and 142b, which are bit lines; and M2 conductors 143a and 143b, which are word line interconnects. M2 conductor 140 is shown in FIG. 1A as an integral unit shared across sections 110a and 110b.

Figure 1B:
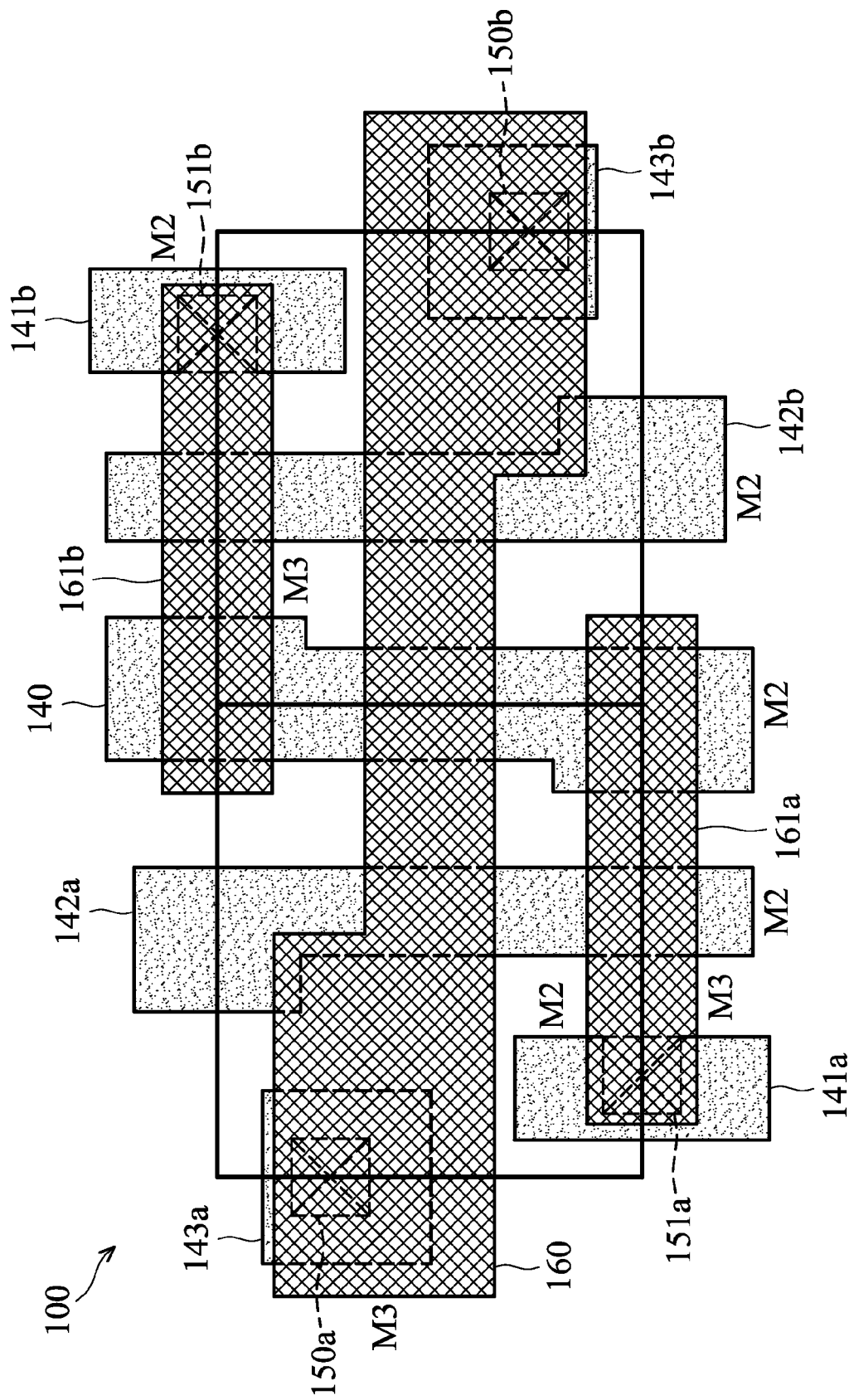
FIG. 1B is a layout diagram showing a second layer and a third layer of an interconnect structure in accordance with some embodiments.
Figure 2:
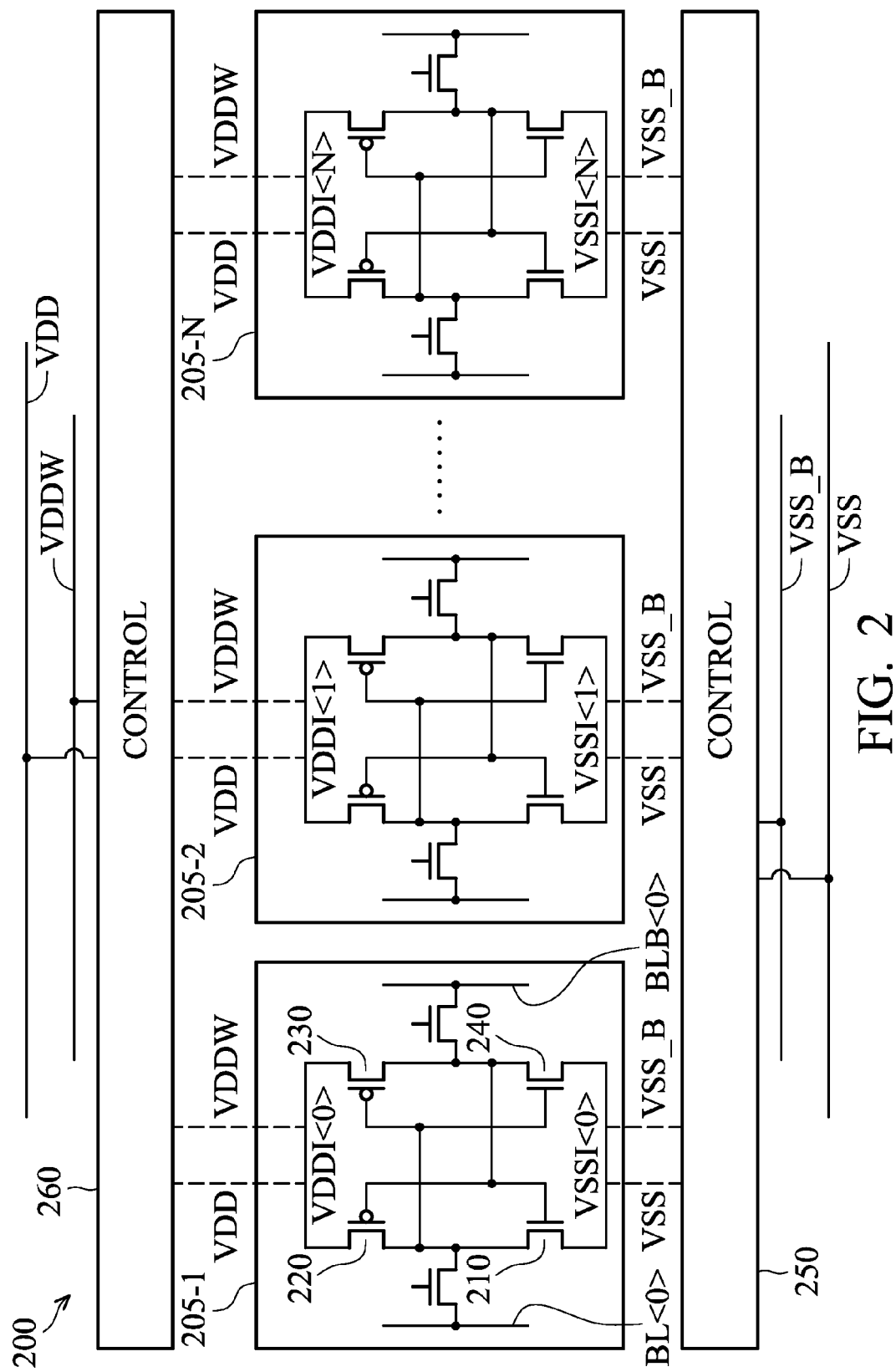
FIG. 2 is a block diagram of a memory circuit in accordance with some embodiments.

FIG. 1B is a layout diagram showing a second layer M2 and a third layer M3 of the interconnect structure 100 in accordance with some embodiments. Vias 150a, 150b, 151a, and 151b are provided as shown in FIG. 1B for coupling of M2 and M3 conductors in the respective second and third layers. As shown in FIG. 1B, the third layer includes a M3 conductor 160, which provides a word line that extends across the width of the interconnect structure 100; and M3 conductors 161a and 161b, which provide coupling VSSI.

Figure 1C:
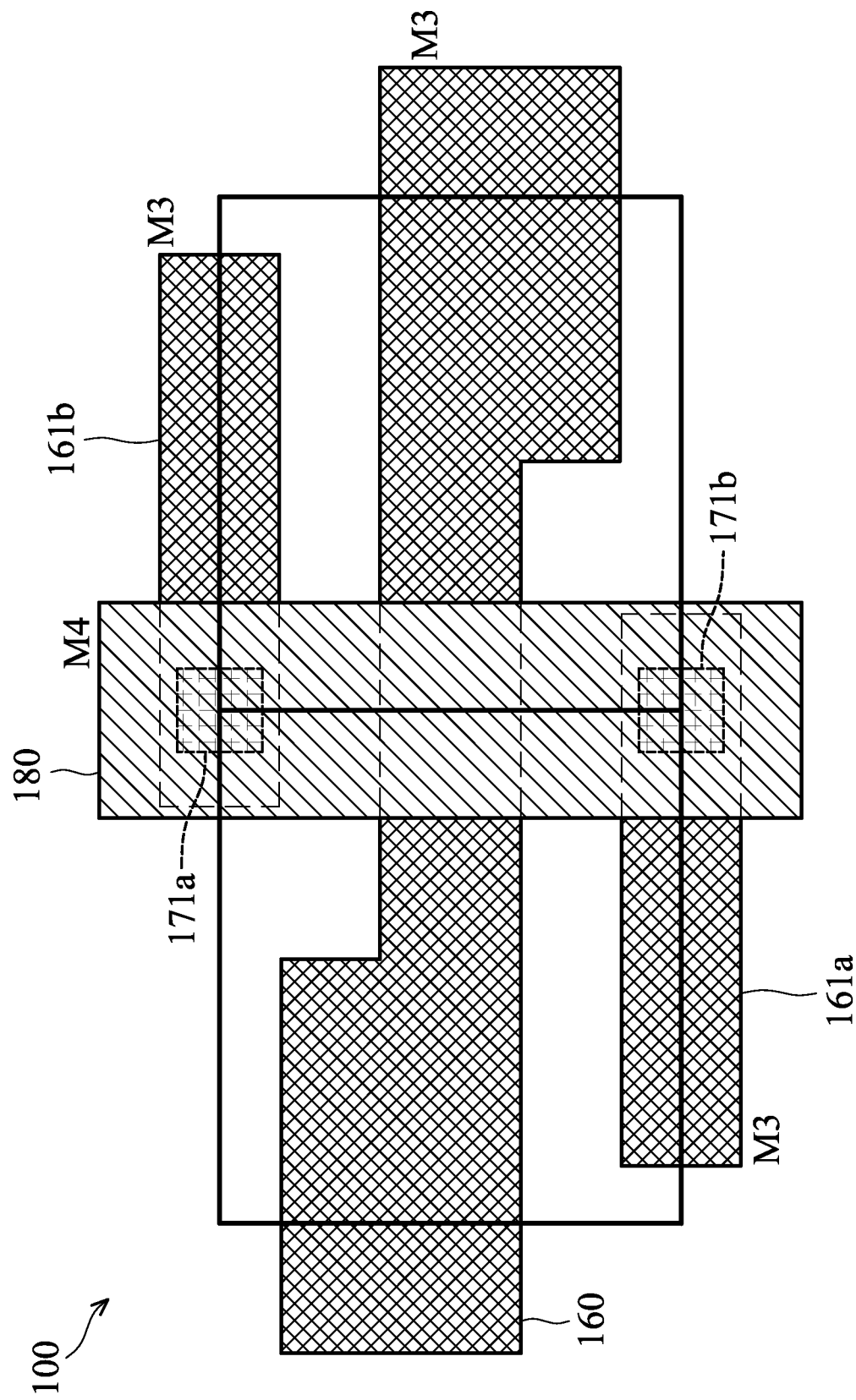
FIG. 1C is a layout diagram showing a third layer and a fourth layer of an interconnect structure in accordance with some embodiments.

FIG. 1C is a layout diagram showing a third layer M3 and a fourth layer M4 of the interconnect structure 100 in accordance with some embodiments. Vias 171a and 171b are provided as shown in FIG. 1C for coupling M3 and M4 conductors of the respective third and fourth layers. As shown in FIG. 1C, the fourth layer M4 includes a M4 conductor 180, which provides coupling to VSSI.

Figure 1D:
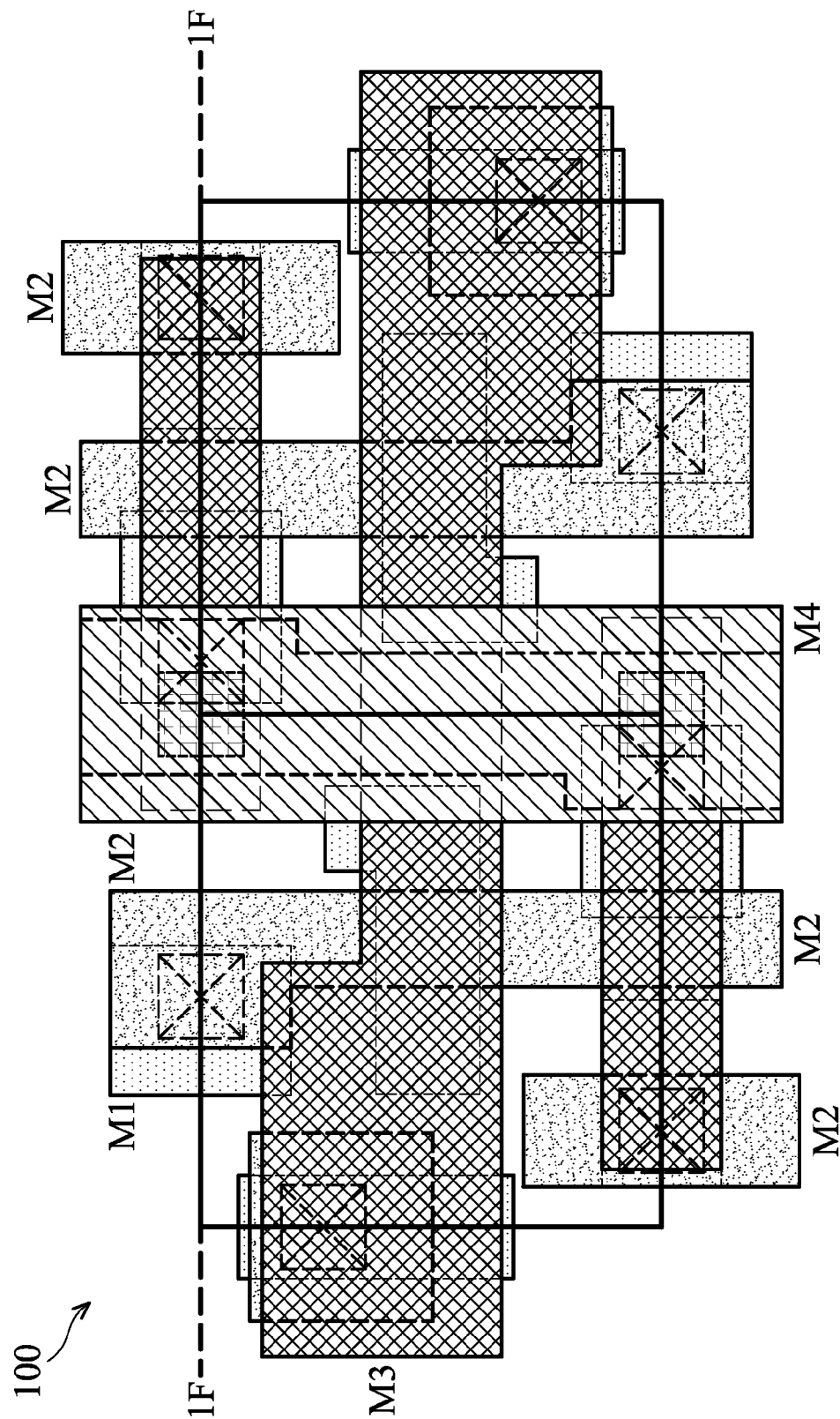
FIG. 1D is a layout diagram showing a first through a fourth layer of an interconnect structure in accordance with some embodiments.

FIG. 1D is a layout diagram showing a first through a fourth layer of the interconnect structure 100 in accordance with some embodiments. For convenience and ease of understanding (i.e., for simplicity, because many overlaid components are shown), reference labels are not shown in FIG. 1D; individual components may be identified with respect to their corresponding locations in FIGS. 1A, 1B, and/or 1C. FIG. 1D shows a section line 1F-1F that corresponds to a cross section discussed below in the context of FIG. 1F.

Figure 1E:
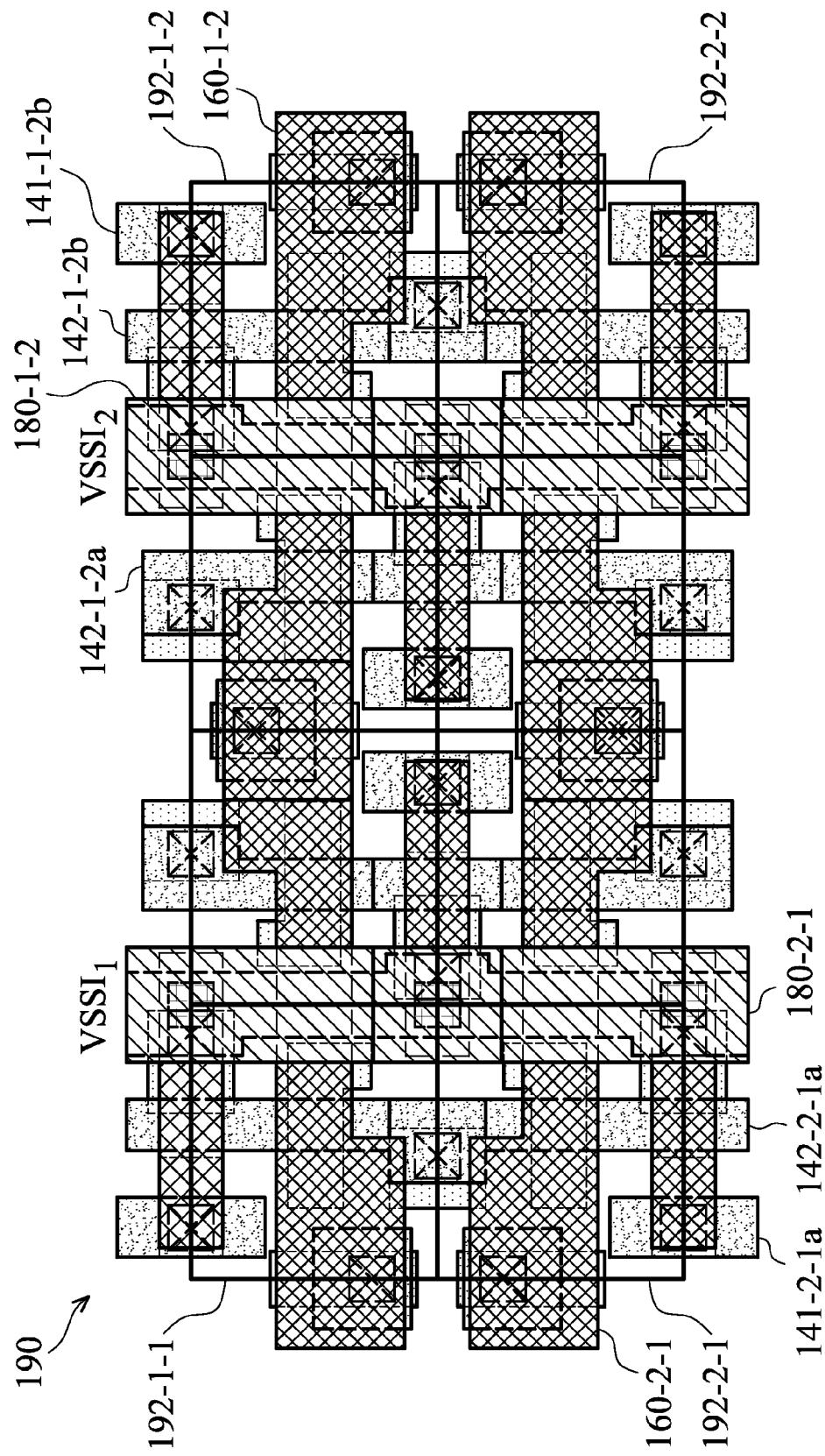
FIG. 1E is a layout diagram showing an interconnect structure cell array in accordance with some embodiments.
Figure 1F:
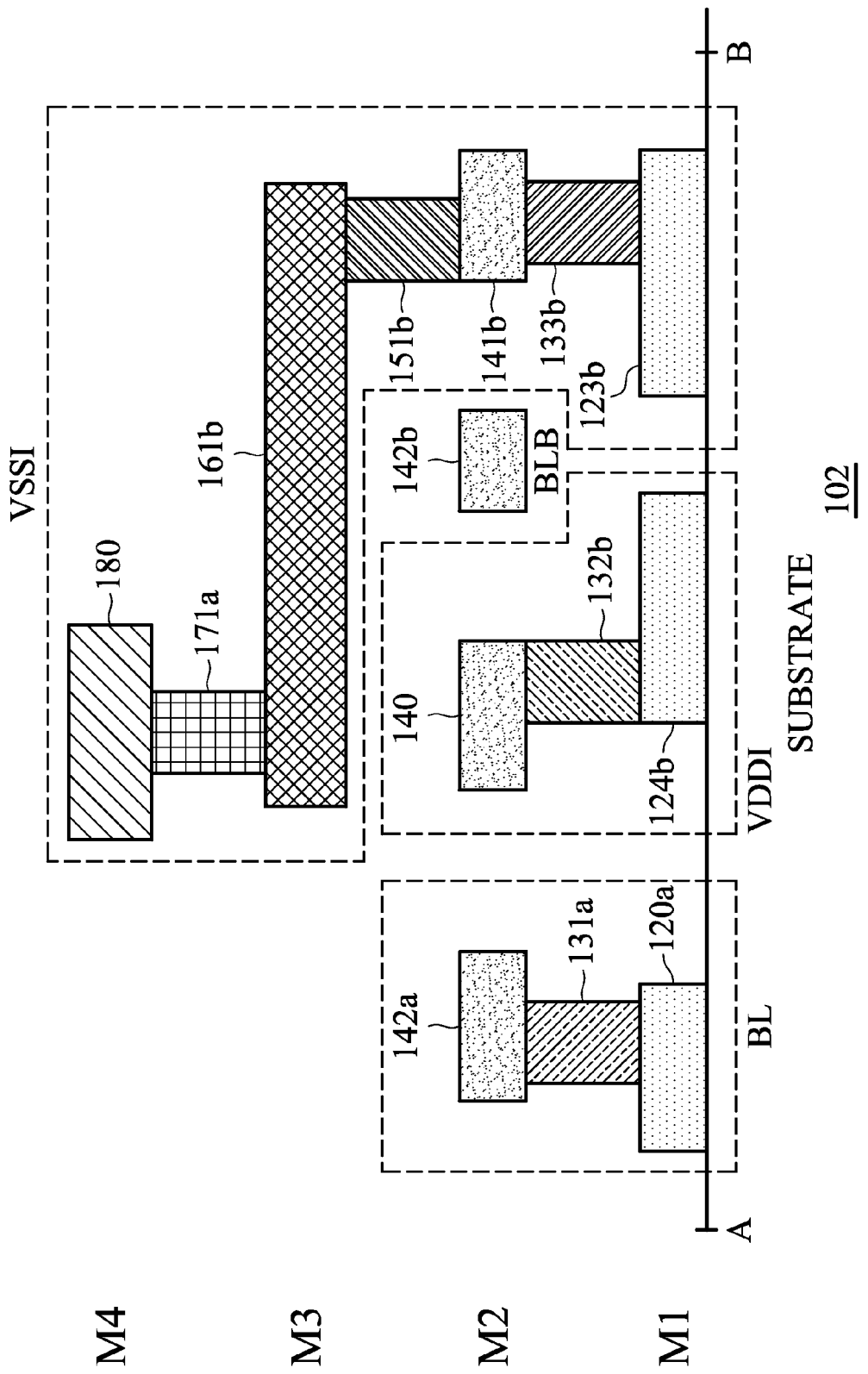
FIG. 1F is a cross-sectional view, taken along section line 1F-1F of FIG. 1D, of an interconnect structure in accordance with some embodiments.

FIG. 1E is a layout diagram showing an interconnect structure cell array 190 in accordance with some embodiments. As mentioned above, the interconnect structure 100 may be one of a plurality of interconnect structures arranged in a matrix (array) configuration having rows and columns. For example, two rows and two columns are shown in FIG. 1E. Each cell in the matrix (array) 190 is denoted with a label that indicates its row and column. For example, cell 192-1-2 is in the first row and second column. Cell 192-1-2 may be interconnect structure 100. It is observed that as shown in the plan view of FIG. 1E, cell 192-1-1 is a "mirror image" of cell 192-1-2 in a first direction (i.e., left and right handed versions), cell 192-2-2 is a mirror image of cell 192-1-2 in a second direction perpendicular to the first direction (i.e., cell 192-2-2 is a "copy" of cell 192-1-2 flipped along a lower cell boundary of cell 192-1-2), and cell 192-2-1 is a copy of cell 192-1-2. Thus, in the plan view of FIG. 1E, the two by two array 190 is invariant under a rotation of 180 degrees. Additional interconnect structure cell arrays may be provided to form a larger interconnect superstructure as understood in the art.

To illustrate the positioning of elements of FIG. 1E relative to similar elements of FIGS. 1A-C, certain ones of the elements in FIG. 1E are labeled with reference labels similar to reference labels in FIGS. 1A-C. For example, M2 conductors 142-1-2a and 141-1-2b, M3 conductor 160-1-2, and M4 conductor 180-1-2 may correspond to M2 conductors 142a and 141b, M3 conductor 160, and M4 conductor 180, respectively, with the positioning in the first row and second column indicated by "1-2" in the reference label. Elements in cell 192-2-1 corresponding to the aforementioned elements of cell 192-1-2 are shown in FIG. 1E with labels containing "2-1" to indicate positioning in the second row and first column. Additional elements are not labeled in FIG. 1E for convenience alone, i.e., to avoid visual clutter.

As shown in FIG. 1E, separate reference voltages VSSI1 and VSSI2 are provided for each column, because none of the VSSI conductors in either cell of the first column are coupled to a corresponding VSSI conductor in a corresponding cell of the second column. VSSI is shared among cells in a given column (i.e., across the rows) by conductor 180. Referring to FIGS. 1A and 1E, VDDI (provided by M1 conductor 124b and M2 conductor 140 as shown in FIG. 1E) is shared across the cells of each column, i.e., across the rows. Further, a separate VDDI voltage is provided for each column, because none of the VDDI conductors in either cell of the first column are coupled to a corresponding VDDI conductor in a corresponding cell of the second column. Advantages in various embodiments provided by such independent VDDI and/or VSSI couplings on a per-column basis are described in further detail below with regard to circuit implementations.

FIG. 1F is a cross-sectional view, taken along section line 1F-1F of FIG. 1D, of the interconnect structure 100 in accordance with some embodiments. Cell boundaries in a horizontal direction (corresponding to the width of the cell 100, as logically indicated by square 112a and 112b of FIG. 1A), are marked in FIG. 1F at positions A and B. In some embodiments, none of the M1 conductor 123b, M2 conductor 141b, M3 conductor 161b, and M4 conductor 180 in FIG. 1F that form VSSI nodes is shared (coupled) with a corresponding component in a cell in another column (to the left of position A and/or to the right of position B). Similarly, neither of the M1 conductor 124b and M2 conductor 140 that form VDDI nodes is shared (coupled) with a corresponding component in a cell in another column. Further, in the cross-sectional view of FIG. 1F, M3 conductor 161b is formed above M2 conductors 140, 142b, and 141b but does not overlie M2 conductor 142a and thus does not extend across a width of the cell 100. An active region of a bit cell is not shown above the substrate 102 in FIG. 1F for convenience but is understood to provide bit cell data storage functionality.

Various embodiments directed to layout as described above may be applied to circuit implementations for data storage applications, as described below in the context of FIGS. 2-4. Comparison of FIGS. 2 and 1F shows how layout elements of FIGS. 1A-F correspond to circuit elements of FIGS. 2-4.

FIG. 2 is a block diagram of a memory circuit 200 in accordance with some embodiments. Memory circuit 200 comprises a plurality of memory cells 205-1, 205-2, ..., 205-N (generally 205), which may be static random access memory (SRAM) cells. It should be understood that where certain descriptions are provided below for certain memory cells (bit cells) in memory circuit 200, the descriptions apply to the other memory cells as well. Memory cells 205 are shown in FIG. 2 as being in different columns of an array and in the same row.

Memory cell 205-1 includes bit lines BL<0> and BLB<0>, which correspond to respective bit lines BL and BLB of FIG. 1F. A first reference node VSS has a first reference voltage which may correspond to ground. A second reference node VSS_B has a second reference voltage that is different from (e.g., higher than) the voltage at VSS. For convenience, VSS refers to both reference node VSS and to the voltage at that node, as is understood by one of ordinary skill in the art; this convention applies to other nodes described below as well. A control circuit 250 controls whether each memory cell 205 is coupled to VSS or to VSS_B. In other words, control circuit 250 selectively couples each memory cell 205 to either VSS or VSS_B, but not both; the conditional couplings are shown as dashed lines in FIG. 2. The coupling between a memory cell 205 (i.e., between a memory cell in a particular column, as the memory cells 205 are in different columns) and one of the reference nodes VSS or VSS_B is determined by control circuit 250 independently of a reference coupling arrangement of any of the other memory cells. A switch (e.g., switch 451 or 452 of FIG. 4) is used to connect a column to VSS or VSS_B, as described further below in the context of FIG. 4. For example, memory cell 205-1 may be coupled to VSS to provide a reference rail voltage VSSI<0>, corresponding to a reference rail (denoted VSSI for convenience), to sources of NMOS transistors 210 and 240, and memory cell 210-2 may be coupled to VSS_B to provide a reference rail voltage VSSI<1> to sources of NMOS transistors and 210 and 240, where VSSI<0> is different from VSSI<1> because VSS is different from VSS_B. Thus, reference rail voltage VSSI<0> may be provided by VSSI conductors (e.g., conductors 180, 161b, 141b, and 123b) from one interconnect structure as in FIG. 1F, and reference rail voltage VSSI<1> may be provided by VSSI conductors from another interconnect structure. The coupling determination (whether to couple a column to VSS or VSS_B) is made on a per-column basis. Cells 205 are in different columns and in the same row, so the reference rail voltages VSSI are provided separately to memory cells on a per-column basis.

By selectively providing reference voltage VSS or reference voltage VSS_B to memory cell 205-1, an operation of writing data to the memory cell 205-1 is made more efficient and reliable. This technique is referred to herein as a "write assist." A write operation is assisted by coupling reference rail VSSI<0> to VSS_B during the write operation. VSSI<0> may be coupled to VSS at other times. By coupling VSSI<0> to VSS_B instead of VSS during a write operation, the voltage at one of the transistors 210, 240 (depending on which bit value is being written) is pulled down easier, because the rail voltage VSSI<0> is pushed up.

During standby mode, VSSI<0> is coupled to VSS_B to reduce leakage of the memory cell 205-1. During a read operation, VSSI is coupled to VSS. By coupling VSSI of various memory cells 205 to VSS or VSS_B on a per column basis (i.e., by enabling VSSI<0> to differ from VSSI<1>), leakage is reduced in some embodiments during a read operation.

In some embodiments, a second control circuit provides conditional coupling between a power supply rail node VDDI<0> and either a first power supply node VDD or a second power supply node VDDW having a voltage VDDW less than VDD and greater than a minimum memory cell data retention voltage. Following the convention mentioned above, the first power supply node and its voltage are both denoted VDD for convenience. Control circuit 260 couples an accessed memory cell (e.g., memory cell 205-1), and specifically a power supply rail (e.g., VDDI<0>), to VDDW during a write operation. The write operation is thereby assisted, as voltages at gates of respective transistors 210, 220 are pulled down easier to 0 from VDDW or are pulled up easier to VDDW from 0. During standby mode, VDDI<1> may be coupled to VDDW in some embodiments to reduce leakage. Power supply rail voltage VDDI<0> may be provided by VDDI conductors (e.g., conductors 140 and 124b) from one interconnect structure as in FIG. 1F, and power supply rail voltage VDDI<1> may be provided by VDDI conductors from another interconnect structure. Thus, the power supply rail voltages are provided separately to memory cells on a per-column basis.

Thus, memory circuit 200 provides for independent coupling between each memory cell and either VSS or VSS_B, thereby assisting a write operation for an accessed memory cell (or accessed memory cells) from the reference (VSS). By raising local VSSI voltages of accessed memory cells, a minimum write voltage referred to as $V_{ccmin\text{-}write}$ is reduced; $V_{ccmin\text{-}write}$ is the minimum voltage for writing data into memory cells. Raising local VSSI voltages also reduces leakage at memory cells. Furthermore, memory circuit 200 also provides for a write assist from the VDD side, also on a per-memory-cell (independent) basis. Lowering local VDDI voltages also helps reduce memory cell leakage currents.

Figure 3:
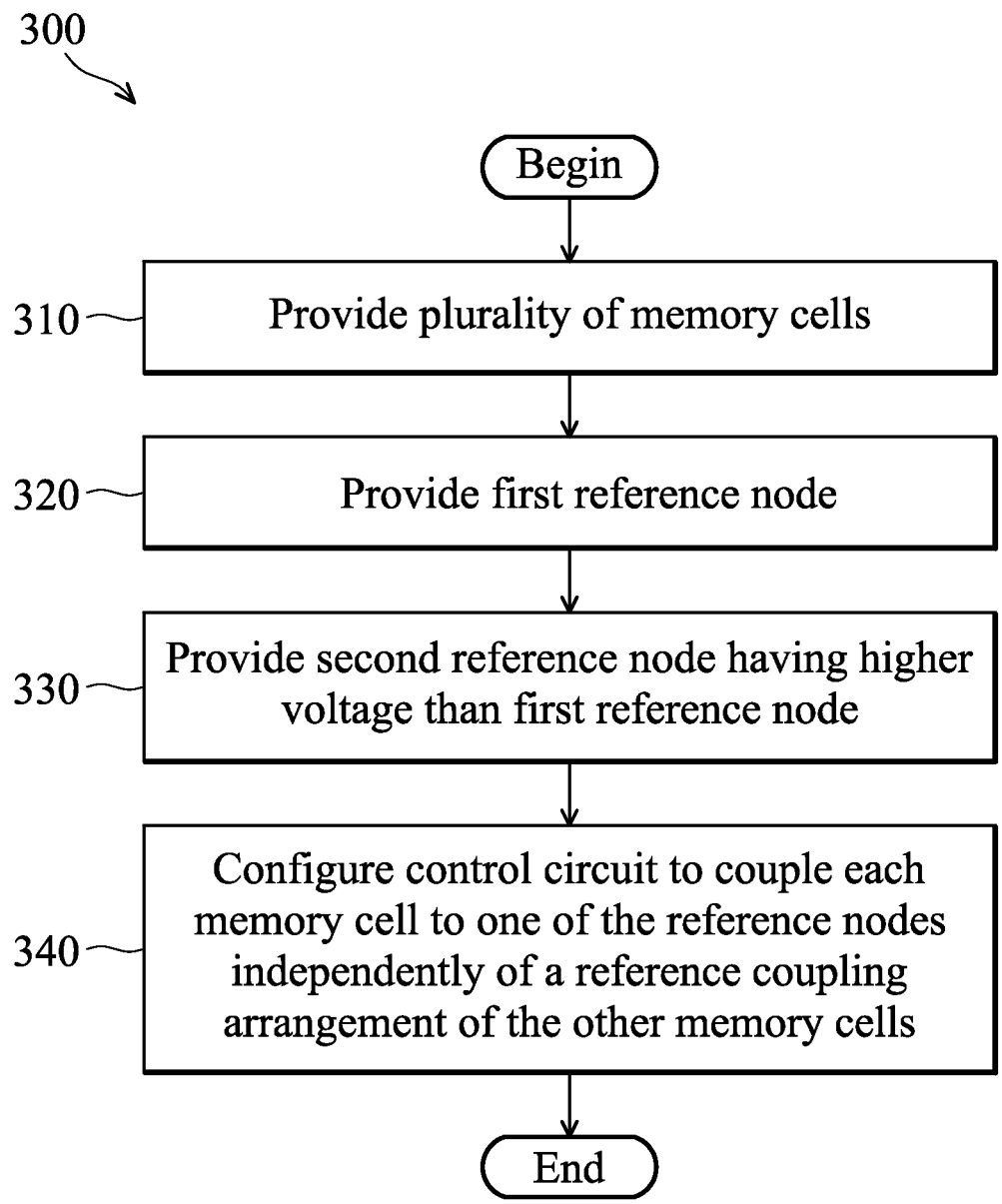
FIG. 3 is a flow diagram in accordance with some embodiments.

FIG. 3 is a flow diagram in accordance with some embodiments. After process 300 begins, a plurality of memory cells are provided (310). A first reference node VSS is provided (320). A second reference node VSS_B having a voltage different from that of the first reference node is provided (330). A control circuit is configured (340) to couple each memory cell in a column to one of the reference nodes independently of a reference coupling arrangement of the memory cells in other columns.

FIG. 4 is a circuit diagram of a memory circuit 400 in accordance with some embodiments. Memory circuit 400 has a plurality of memory cells 405-1, 405-2, 405-3, and 405-4 (generally 405) arranged in rows and columns. Four memory cells are shown in FIG. 4 arranged in two rows and two columns, but different numbers of memory cells may be provided, and there may be other than two rows and other than two columns. A first column 407 is shown in FIG. 4; a second column is not denoted with a reference character for convenience only. Memory cells 405 may be similar to memory cells 205 in FIG. 2. Memory circuit 400 has a first control circuit 450 that selectively couples the memory cells in each column (specifically, a reference rail voltage VSSI therein) to either a first reference node VSS or a second reference node VSS_B having a different (e.g., higher) voltage than VSS. The reference rail voltages for the first and second columns are denoted VSSI<0> and VSSI<1>, respectively, in FIG. 4. A reference coupling arrangement (i.e., a coupling to a reference node) for each column (i.e., of the memory cells in each column) is determined by control circuit 450 independently of a coupling arrangement for the other columns. For example, one of the two columns shown in FIG. 4 may be coupled to VSS and the other to VSS_B. Both columns may be coupled to VSS, or both columns may be coupled to VSS_B, as well.

In some embodiments, control circuit 450 comprises two switches for each column, e.g., switches 451 and 452, which may be NMOS transistors, corresponding to column 407. Opposite control signals (e.g., one high and one low) may be provided to switches 451 and 452 to couple column 407 to only one of VSS and VSS_B; such opposite polarities may be provided by an inverter 457. Based on a control signal EN<0> (where N stands for NMOS) provided to a gate of transistor 451, column 407 is thus coupled to either VSS or VSS_B. Similar switches 453 and 454, inverter 458, and control signal EN<1> are provided to control a reference coupling arrangement for the second column comprising memory cells 405-3 and 405-4. Transistors 451, 452, 453, and 454 are referred to as reference write assist transistors because they assist with write operations through conditional couplings to reference nodes. Although NMOS transistors 451, 452, 453, and 454 and inverters 457 and 458 are shown in FIG. 4 to provide conditional coupling based on control signals EN<0>, EN<1> (which may be a single multi-bit control signal in some embodiments), other circuitry may be used as well to provide such conditional coupling. Because different control signals may be provided to the various columns (i.e., EN<0> may be different from EN<1>), the columns may be coupled independently of one another. Coupling the memory cells of a column to VSS_B during a write operation provides a write assist as described above in the context of FIG. 2, so memory circuit 400 enables a write assist for accessed columns without subjected non-accessed columns (i.e., columns not written to) to the higher reference voltage VSS_B.

In some embodiments, memory circuit 400 couples each column (specifically, a power supply rail node of each memory cell therein) to either a first power supply node VDD or a second power supply node VDDW that has a voltage lower than VDD. Coupling a column to VDDW instead of VDD during a write operation provides a write assist for a write operation to the memory cells of that column as described above in the context of FIG. 2. A second control circuit 460 controls the power supply coupling arrangement for each column, i.e., determines whether to couple the memory cells of each column to VDD or to VDDW, and this coupling arrangement is performed on a per-column basis, i.e., independently of a coupling arrangement for the other columns. Control circuit 460 may comprise a pair of switches, e.g., PMOS transistors and an inverter for each column, to selectively couple each column to VDD or VDDW. Transistors 461, 462, 463, and 464 are referred to as power supply write assist transistors because they assist with write operations through conditional couplings to power supply nodes. Although PMOS transistors 461, 462, 463, and 464 and inverters 467 and 468 are shown in FIG. 4 to provide conditional coupling based on control signals EP<0>, EP<1> (which may be a single multi-bit control signal in some embodiments), other circuitry may be used as well to provide such conditional coupling.

Some embodiments may be implemented in a 28 nm CMOS fabrication process or in other fabrication processes. In some embodiments, independent couplings of various columns to various reference and/or power supply nodes improve write performance, e.g., through write assists as described above, and also reduce power consumption by reducing $V_{ccmin\text{-}write}$ and enabling additional high speed same-cycle retention-until-access power saving methodologies, in which memory bit cells remain in a retention mode (power saving mode) until the memory bit cells perform normal access operations.

In some embodiments, a semiconductor device has first and second interconnect structures in first and second columns, respectively, of an array having at least one row and at least two columns. The first and second interconnect structures are in a first row. Each of the first and second interconnect structures has a reference voltage node and first, second, third, and fourth conductors coupled to each other. The first, second, third, and fourth conductors are formed at a first layer, a second layer, a third layer, and a fourth layer, respectively, over a substrate having a plurality of devices defining a plurality of bit cells. The reference voltage node of each interconnect structure provides a respectively separate reference voltage to a bit cell corresponding to said interconnect structure. None of the first, second, third, and fourth conductors in one interconnect structure are connected to a corresponding conductor in the other interconnect structure. The second layer is above the first layer, the third layer is above the second layer, and the fourth layer is above the third layer.

In some embodiments, a semiconductor device has first and second interconnect structures in first and second columns, respectively, of an array having at least one row and at least two columns. The first and second interconnect structures are in a first row. Each of the first and second interconnect structures has a power supply node and first and second conductors coupled to said power supply node and to each other. The first and second conductors are formed at a first layer and a second layer, respectively, over a substrate having a plurality of devices defining a plurality of bit cells. The second layer is above the first layer. The power supply node of each interconnect structure provides a respectively separate power supply voltage to a bit cell corresponding to said interconnect structure. Neither of the first and second conductors in one interconnect structure is connected to a corresponding conductor in the other interconnect structure.

In some embodiments, a method includes connecting first and second bit cells to first and second interconnect structures, respectively. The first and second interconnect structures are in a first row of an array having at least one row and at least two columns. A respective path is provided for conducting electricity to or from a reference voltage node of each interconnect structure. Each reference voltage node is conductively coupled to at least one conductor at each of a first layer, a second layer, a third layer, and a fourth layer. The reference voltage nodes of each interconnect structure are electrically isolated from each other. The path for conducting electricity through each interconnect structure is configured to provide a respectively separate reference voltage to a bit cell corresponding to that interconnect structure.

Although examples are illustrated and described herein, embodiments are nevertheless not limited to the details shown, since various modifications and structural changes may be made therein by those of ordinary skill within the scope and range of equivalents of the claims.

What is claimed is:

1. A semiconductor device comprising:
   first and second interconnect structures in first and second columns, respectively, of an array having at least one row and at least two columns, the first and second interconnect structures being in a first row, each of the first and second interconnect structures comprising:
   a first reference voltage node,
   a first power supply node,
   first, second, third, and fourth conductors coupled to each other and formed at a first layer, a second layer, a third layer, and a fourth layer, respectively, over a substrate having a plurality of devices defining a plurality of bit cells, the first reference voltage node of each interconnect structure providing a respectively separate reference voltage to a bit cell corresponding to said interconnect structure, none of the first, second, third, and fourth conductors being connected to a corresponding conductor in the other interconnect structure, the first reference voltage node of each interconnect structure being switchable between at least two voltage values; and
   fifth and sixth conductors coupled to the first power supply node and to each other and formed at the first and second layers, respectively, the first power supply node of each respective interconnect structure providing a respectively separate power supply voltage to a bit cell corresponding to said respective interconnect structure, neither of the fifth and sixth conductors of each respective interconnect structure being connected to a corresponding conductor in the other interconnect structure, the first power supply node of each interconnect structure being switchable between at least two voltage values;
   wherein the second layer is above the first layer, the third layer is above the second layer, and the fourth layer is above the third layer;
   wherein the interconnect structure in each column is coupled to a single reference voltage.

2. The device of claim 1, wherein each of the first and second interconnect structures further comprises:
   a first bit line comprising a seventh conductor and an eighth conductor coupled to each other and formed at the first and second layers, respectively; and
   a second bit line comprising a ninth conductor formed at the second layer.

3. The device of claim 1, further comprising third and fourth interconnect structures in a second row, the third and fourth interconnect structures being in the first and second columns, respectively, each of the interconnect structures in the second row having a second power supply node, at least one of the fifth and sixth conductors of each interconnect structure in the first row being connected to a corresponding conductor of a corresponding interconnect structure in the second row, wherein the first power supply nodes of the interconnect structures in the first row are coupled to the second power supply nodes of the respective interconnect structures in the second row.

4. The device of claim 1, further comprising third and fourth interconnect structures in a second row, the third and fourth interconnect structures being in the first and second columns, respectively, each of the interconnect structures in the second row having a second reference voltage node, the fourth conductor of each interconnect structure in the first row being connected to a corresponding fourth conductor of a corresponding interconnect structure in the second row, wherein the first reference voltage nodes of the interconnect structures in the first row are coupled to the second reference voltage nodes of the respective interconnect structures in the second row.

5. The device of claim 1, further comprising a via coupling the third and fourth conductors.

6. The device of claim 1, wherein the first reference voltage node of the first interconnect structure is configured to provide a different reference voltage than the first reference voltage node of the second interconnect structure.

7. The device of claim 1, wherein the first power supply node of the first interconnect structure is configured to provide a different power supply voltage than the first power supply node of the second interconnect structure.

8. A semiconductor device comprising:
   first and second interconnect structures in first and second columns, respectively, of an array having at least one row and at least two columns, the first and second interconnect structures being in a first row, each of the first and second interconnect structures comprising:
      a first reference voltage node,
      a first power supply node,
      first and second conductors coupled to the first power supply node and to each other and formed at a first layer and a second layer, respectively, over a substrate having a plurality of devices defining a plurality of bit cells, each bit cell comprising a pair of cross-coupled inverters, each inverter in said pair including an NMOS transistor and a PMOS transistor, source terminals of the respective NMOS transistors in said bit cell both being coupled to the first reference voltage node, the first power supply node of each interconnect structure providing a respectively separate power supply voltage to a bit cell corresponding to said interconnect structure, neither of the first and second conductors being connected to a corresponding conductor in the other interconnect structure, the first power supply node of each interconnect structure being switchable between at least two voltage values, and
      third, fourth, fifth, and sixth conductors coupled to each other and formed at the first layer, the second layer, a third layer, and a fourth layer, respectively, the first reference voltage node of each interconnect structure providing a respectively separate reference voltage to a bit cell corresponding to said interconnect structure, none of the third, fourth, fifth, and sixth conductors being connected to a corresponding conductor in the other interconnect structure, the first reference voltage node of each interconnect structure being switchable between at least two voltage values;
   wherein the second layer is above the first layer, the third layer is above the second layer, and the fourth layer is above the third layer.

9. The device of claim 8, wherein each of the first and second interconnect structures further comprises:
   a first bit line comprising a seventh conductor and an eighth conductor coupled to each other and formed at the first and second layers, respectively; and
   a second bit line comprising a ninth conductor formed at the second layer.

10. The device of claim 8, further comprising third and fourth interconnect structures in a second row, the third and fourth interconnect structures being in the first and second columns, respectively, each of the interconnect structures in the second row having a second reference voltage node, the sixth conductor of each interconnect structure in the first row being connected to a corresponding sixth conductor of a corresponding interconnect structure in the second row, wherein the first reference voltage nodes of the interconnect structures in the first row are coupled to the second reference voltage nodes of the respective interconnect structures in the second row.

11. The device of claim 8, further comprising third and fourth interconnect structures in a second row, the third and fourth interconnect structures being in the first and second columns, respectively, each of the interconnect structures in the second row having a second power supply node, at least one of the first and second conductors of each interconnect structure in the first row being connected to a corresponding conductor of a corresponding interconnect structure in the second row, wherein the first power supply nodes of the interconnect structures in the first row are coupled to the second power supply nodes of the respective interconnect structures in the second row.

12. The device of claim 8, further comprising a via coupling the fifth and sixth conductors.

13. The device of claim 8, wherein the first power supply node of the first interconnect structure is configured to provide a different power supply voltage than the first power supply node of the second interconnect structure.

14. The device of claim 8, wherein the first reference voltage node of the first interconnect structure is configured to provide a different reference voltage than the first reference voltage node of the second interconnect structure.

15. A method comprising:
   connecting first and second bit cells to a first and a second interconnect structure, respectively, the first and second interconnect structures being in a first row of an array having at least one row and at least two columns, the first and second interconnect structures being in first and second columns, respectively, of the array;
   providing a respective path for conducting electricity to or from a reference voltage node of each interconnect structure, each reference voltage node conductively coupled to at least one conductor at each of a first layer, a second layer, a third layer, and a fourth layer of each interconnect structure; and
   electrically isolating the reference voltage nodes of each interconnect structure from each other, wherein the path for conducting electricity through each interconnect structure is configured to provide a respectively separate reference voltage to a bit cell corresponding to said interconnect structure, and the reference voltage node of each interconnect structure is switchable between at least two voltage values, and wherein the interconnect structure in each column is coupled to a single reference voltage;
   providing a respective path for conducting electricity along a power supply node of each interconnect structure, each power supply node including at least one conductor at each of the first and second layers; and
   electrically isolating the power supply nodes of each interconnect structure from each other, wherein the path for conducting electricity through each interconnect structure is configured to provide a respectively separate power supply voltage to a bit cell corresponding to said interconnect structure.

16. The method of claim 15, wherein the reference voltage node of the first interconnect structure is configured to provide a different reference voltage than the reference voltage node of the second interconnect structure.

17. The method of claim 15, wherein the power supply node of the first interconnect structure is configured to provide a different power supply voltage than the power supply node of the second interconnect structure.

* * * * *